(12) United States Patent
Freer et al.

(10) Patent No.: US 7,696,141 B2
(45) Date of Patent: Apr. 13, 2010

(54) CLEANING COMPOUND AND METHOD AND SYSTEM FOR USING THE CLEANING COMPOUND

(75) Inventors: Erik M. Freer, Campbell, CA (US); John M. de Larios, Palo Alto, CA (US); Katrina Mikhaylichenko, San Jose, CA (US); Michael Ravkin, Sunnyvale, CA (US); Mikhail Korolik, San Jose, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 644 days.

(21) Appl. No.: 11/347,154

(22) Filed: Feb. 3, 2006

(65) Prior Publication Data

US 2006/0128600 A1 Jun. 15, 2006

Related U.S. Application Data

(63) Continuation-in-part of application No. 10/608,871, filed on Jun. 27, 2003, now abandoned.

(60) Provisional application No. 60/755,377, filed on Dec. 30, 2005.

(51) Int. Cl.
C11D 1/02 (2006.01)
(52) U.S. Cl. .................................. 510/175; 134/1.3
(58) Field of Classification Search ................ 510/175; 134/1.3
See application file for complete search history.

(56) References Cited

U.S. PATENT DOCUMENTS

| 1,901,434 A | * | 3/1933 | Cade et al. ................ 510/389 |
| 4,235,794 A | * | 11/1980 | Rieber et al. ................ 554/73 |
| 6,500,862 B1 | * | 12/2002 | Zanello ...................... 514/558 |
| 6,849,581 B1 | * | 2/2005 | Thompson et al. .......... 507/118 |
| 2003/0199415 A1 | * | 10/2003 | Mondin ...................... 510/293 |

* cited by examiner

*Primary Examiner*—Gregory E Webb
(74) *Attorney, Agent, or Firm*—Martine Penilla & Gencarella, LLP (57) ABSTRACT

A cleaning compound is provided. The cleaning compound includes about 0.1 weight percent to about 10 weight percent of a fatty acid dispersed in water. The cleaning compound includes an amount of a base sufficient to bring a pH of the fatty acid water solution to about a level where above about 50% of the dispersed fatty acid is ionized. A method for cleaning a substrate, a system for cleaning a substrate, and a cleaning solution prepared by a process are also provided.

28 Claims, 6 Drawing Sheets

CLEANING COMPOUND AND METHOD AND SYSTEM FOR USING THE CLEANING COMPOUND

CROSS REFERENCE TO RELATED APPLICATIONS

This application claims the benefit of U.S. Provisional Application No. 60/755,377, filed Dec. 30, 2005. Additionally, this application is a continuation-in-part of prior application Ser. No. 10/608,871, filed Jun. 27, 2003, and entitled "Method and Apparatus for Removing a Target Layer From a Substrate Using Reactive Gases." The disclosure of each of the above-identified applications is incorporated herein by reference for all purposes. This application is related to U.S. patent application Ser. No. 10/816,337, filed on Mar. 31, 2004, and entitled "Apparatuses and Methods for Cleaning a Substrate," and U.S. patent application Ser. No. 11/173,132, filed on Jun. 30, 2005, and entitled "System and Method for Producing Bubble Free Liquids for Nanometer Scale Semiconductor Processing," and U.S. patent application Ser. No. 11/153,957, filed on Jun. 15, 2005, and entitled "Method and Apparatus for Cleaning a Substrate Using Non-Newtonian Fluids," and U.S. patent application Ser. No. 11/154,129, filed on Jun. 15, 2005, and entitled "Method and Apparatus for Transporting a Substrate Using Non-Newtonian Fluid,"and U.S. patent application Ser. No. 11/174,080, filed on Jun. 30, 2005, and entitled "Method for Removing Material from Semiconductor Wafer and Apparatus for Performing the Same," and U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids," and U.S. patent application Ser. No. 11/336,215, filed on Jan. 20, 2006, and entitled "Method and Apparatus for Removing Contamination from Substrate." The disclosure of each of these related applications is incorporated herein by reference for all purposes.

BACKGROUND

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

During the series of manufacturing operations, the wafer surface is exposed to various types of contaminants. Essentially any material present in a manufacturing operation is a potential source of contamination. For example, sources of contamination may include process gases, chemicals, deposition materials, and liquids, among others. The various contaminants may deposit on the wafer surface in particulate form. If the particulate contamination is not removed, the devices within the vicinity of the contamination will likely be inoperable. Thus, it is necessary to clean contamination from the wafer surface in a substantially complete manner without damaging the features defined on the wafer. The size of particulate contamination is often on the order of the critical dimension size of features fabricated on the wafer. Removal of such small particulate contamination without adversely affecting the features on the wafer can be quite difficult.

Conventional wafer cleaning methods have relied heavily on mechanical force to remove particulate contamination from the wafer surface. As feature sizes continue to decrease and become more fragile, the probability of feature damage due to application of mechanical force to the wafer surface increases. For example, features having high aspect ratios are vulnerable to toppling or breaking when impacted by a sufficient mechanical force. To further complicate the cleaning problem, the move toward reduced feature sizes also causes a reduction in the size of particulate contamination that may cause damage. Particulate contamination of sufficiently small size can find its way into difficult to reach areas on the wafer surface, such as in a trench surrounded by high aspect ratio features or bridging of conductive lines, etc. Thus, efficient and non-damaging removal of contaminants during modem semiconductor fabrication represents a continuing challenge to be met by continuing advances in wafer cleaning technology. It should be appreciated that the manufacturing operations for flat panel displays suffer from the same shortcomings of the integrated circuit manufacturing discussed above. Thus, any technology requiring contaminant removal is in need of a more effective and less abrasive cleaning technique.

SUMMARY

Broadly speaking, the present invention fills these needs by providing an improved cleaning technique and cleaning solution. It should be appreciated that the present invention can be implemented in numerous ways, including as a system, an apparatus and a method. Several inventive embodiments of the present invention are described below.

In one embodiment, a cleaning compound is provided. The cleaning compound includes about 0.5 weight percent to about 10 percent of a fatty acid dissolved in water. The cleaning compound includes an amount of a base sufficient to bring a pH of the fatty acid water solution to about a level above where about 50% of the dissolved fatty acid is ionized.

In another embodiment, a method of cleaning a substrate is provided. The method includes applying an emulsion having a first immiscible liquid combined with a second immiscible liquid to a surface of the substrate. The second immiscible liquid forms a plurality of droplets dispersed within the first immiscible liquid, and the emulsion further includes solid particles distributed within the first immiscible liquid. A force having a normal component is applied to one of the solid particles to bring the one of the solid particles within an interaction range of a contaminant on the surface of the substrate. The one of the solid particle and the contaminant are removed from the surface of the substrate.

In yet another embodiment, a system for cleaning a substrate is provided. The system includes a cleaning head configured to be disposed over a surface of the substrate, the cleaning head having multiple cleaning portions. The system includes a cleaning solution reservoir supplying a cleaning solution to one of the multiple cleaning portions. The cleaning solution has a dispersed phase, a continuous phase and particles dispersed within the continuous phase.

In still yet another embodiment, a process for preparing a solution for cleaning a substrate is provided. The process includes preparing a solution of a fatty acid in a solvent within a specified concentration range and adding water to the fatty acid solution. The process also includes stabilization of the solution by adding a surface-active substance or by ionizing the fatty acid in the solution.

Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The embodiments described herein provide for a cleaning technique that eliminates the need for abrasive contact and is efficient at cleaning contaminants from semiconductor substrates, some of which may contain high aspect ratio features. While the embodiments provide specific examples related to semiconductor cleaning applications, these cleaning applications may be extended to any technology requiring the removal of contaminants from a substrate. As described below, a cleaning solution having a continuous phase and a dispersed phase is provided. Solid particles are disseminated throughout the continuous phase. As used herein, the dispersed phase refers to either gas bubbles dispersed throughout the continuous phase, e.g., with reference to a foam, or liquid droplets dispersed throughout the continuous phase, e.g. with reference to an emulsion, or even solids (different than the solid particles) dispersed through the continuous phase. In one embodiment, the dispersed phase provides a vehicle to bring the solid particles proximate to the contaminant in order for the solid particles and the contaminant to interact to eventually remove the contaminant.

Figure 1:
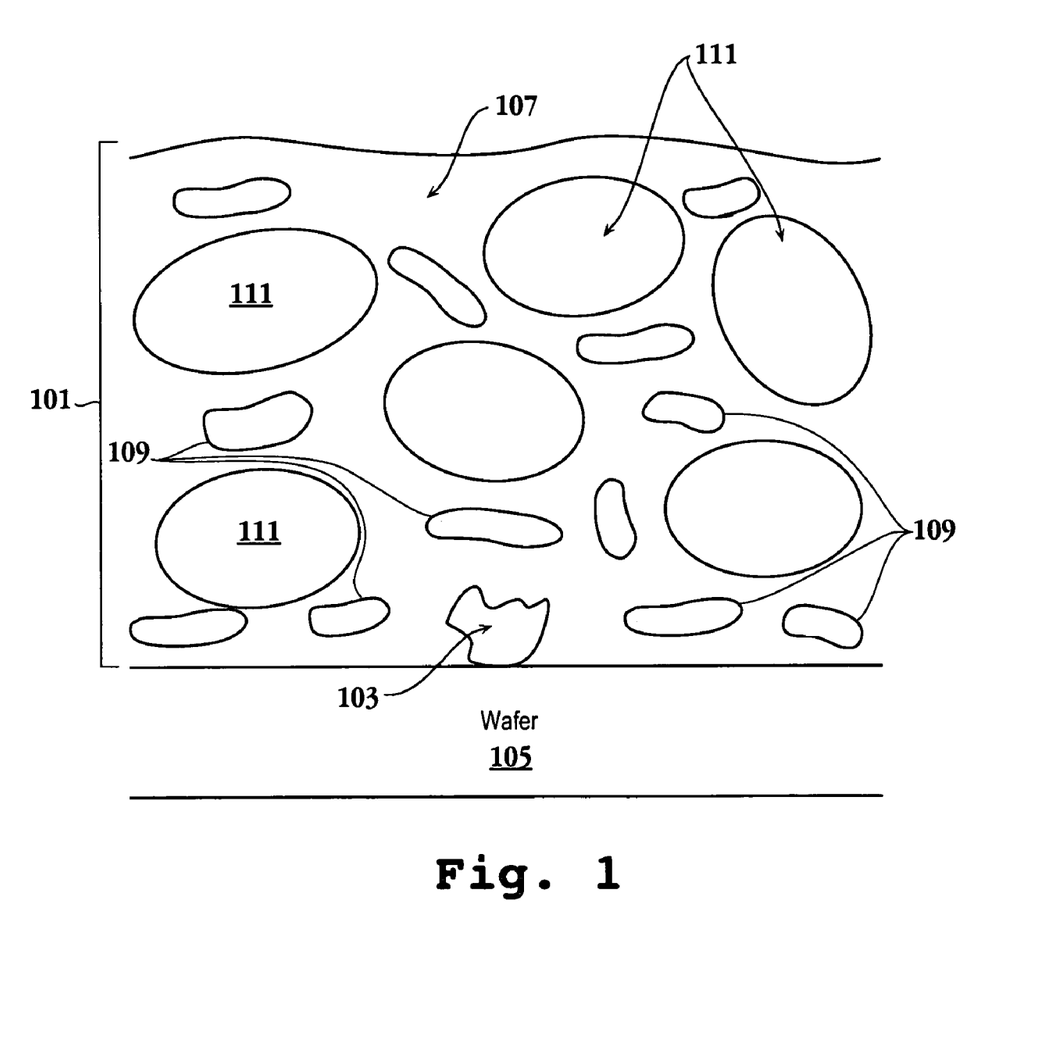
FIG. 1 is an illustration showing a physical diagram of a cleaning material for removing contamination from a semiconductor wafer, in accordance with one embodiment of the present invention.

FIG. 1 is an illustration showing a physical diagram of a cleaning material 101 for removing contamination 103 from a semiconductor wafer ("wafer") 105, in accordance with one embodiment of the present invention. The cleaning material 101 of the present invention includes a continuous liquid medium 107, solid components 109, and immiscible components 111. The solid components 109 and immiscible components 111 are dispersed within the continuous liquid medium 107. In various embodiments, the continuous liquid medium 107 can be either aqueous or non-aqueous. Depending on the particular embodiment, the immiscible components 111 can be defined in either a gas phase, a liquid phase, a solid phase, or a combination of gas, liquid, and solid phases. In one embodiment, the immiscible components 111 are defined as a mixture of immiscible components 111, wherein each immiscible component 111 within the mixture has either a common physical state or a different physical state. For example, in various embodiments the physical states of immiscible components 111 within the mixture of immiscible components 111 can include a gas and a liquid, a gas and a solid, a liquid and a solid, or any combination of multiple gases, multiple liquids, and multiple solids.

It should be appreciated that the immiscible components 111 are immiscible with respect to the continuous liquid medium 107. In one exemplary embodiment, the immiscible components 111 are defined as gas bubbles within the continuous liquid medium 107. In another exemplary embodiment, the immiscible components 111 are defined as liquid droplets within the continuous liquid medium 107. Regardless of the particular embodiment associated with the continuous liquid medium 107 and immiscible components 111, the solid components 109 are dispersed in suspension within the continuous liquid medium 107.

It should be understood that depending on the particular embodiment, the solid components 109 within the cleaning material 101 may possess physical properties representing essentially any sub-state within the solid phase, wherein the solid phase is defined as a phase other than liquid or gas. For example, physical properties such as elasticity and plasticity can vary among different types of solid components 109 within the cleaning material 101. Additionally, it should be understood that in various embodiments the solid components 109 can be defined as crystalline solids or non-crystalline solids. Regardless of their particular physical properties, the solid components 109 within the cleaning material 101 should be capable of avoiding adherence to the surface of wafer 105 when positioned in either close proximity to or contact with the surface of wafer 105. Additionally, the mechanical properties of the solid components 109 should not cause damage to the wafer 105 surface during the cleaning process. Furthermore, the solid components 109 should be capable of establishing an interaction with the contaminant 103 material present on the wafer 105 surface when positioned in either close proximity or contact with the contaminant 103. For example, the size and shape of the solid components 109 should be favorable for establishing the interaction between the solid components 109 and the contaminants 103.

The solid components 109 within the cleaning material 101 should be capable of interacting with contaminants 103 on the wafer 105 while avoiding both adhesion and damage to the wafer 105. In addition, the solid components 109 should avoid dissolution in the liquid medium 107 and should have a surface functionality that enables dispersion throughout the liquid medium 107. For solid components 109 that do not have surface functionality that enables dispersion throughout the liquid medium 107, chemical dispersants may be added to the liquid medium 107 to enable dispersion of the solid components 109. Depending on their specific chemical characteristics and their interaction with the surrounding liquid medium 107, the solid components 109 may take one or more of several different forms. For example, in various embodiments the solid components 109 may form aggregates, colloids, gels, coalesced spheres, or essentially any other type of agglutination, coagulation, flocculation, agglomeration, or coalescence. It should be appreciated that the exemplary list solid component 109 forms identified above is not intended to represent an inclusive list. In other embodiments, the solid components 109 may take a form not specifically identified herein. Therefore, the point to understand is that the solid components 109 can be defined as essentially any solid material capable of functioning in the manner previously described with respect to their interaction with the wafer 105 and the contaminants 103.

Some exemplary solid components 109 include aliphatic acids, carboxylic acids, paraffin, wax, polymers, polystyrene, polypeptides, and other visco-elastic materials. The solid component 109 material should be present at a concentration that exceeds its solubility limit within the liquid medium 107. In addition, it should be understood that the cleaning effectiveness associated with a particular solid component 109 material may vary as a function of temperature, pH, and other environmental conditions.

The aliphatic acids represent essentially any acid defined by organic compounds in which carbon atoms form open chains. A fatty acid is an example of an aliphatic acid that can be used as the solid components 109 within the cleaning material 101. Examples of fatty acids that may be used as the solid components 109 include lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid, lignoceric acid, cerotic acid, and mixtures thereof, among others. In one embodiment, the solid components 109 can represent a mixture of fatty acids defined by various carbon chain lengths extending from C-1 to about C-26. Carboxylic acids are defined by essentially any organic acid that includes one or more carboxyl groups (COOH). When used as the solid components 109, the carboxylic acids can include mixtures of various carbon chain lengths extending from C-1 through about C-100. Also, the carboxylic acids can include other functional groups such as but not limited to methyl, vinyl, alkyne, amide, primary amine, secondary amine, tertiary amine, azo, nitrile, nitro, nitroso, pyridyl, carboxyl, peroxy, aldehyde, ketone, primary imine, secondary imine, ether, ester, halogen, isocyanate, isothiocyanate, phenyl, benzyl, phosphodiester, sulfhydryl, but still maintaining insolubility in the liquid medium 107.

In some embodiments, addition of a dispersant material to the liquid medium 107 may be required to enable a particular type of solid component 109, such as a fatty acid, to disperse throughout the liquid medium 107. For example, a base can be added to the liquid medium 107 to enable suspension of solid components 109 formed from materials such as carboxylic acid or stearic acid that are present in less than stoichiometric quantities. In one embodiment, the base is Ammonium Hydroxide, however, any commercially available base may be used with the embodiments described herein. Additionally, the surface functionality of the solid component 109 materials can be influenced by the inclusion of moieties that are miscible with the liquid medium 107, such as carboxylate, phosphate, sulfate groups, polyol groups, ethylene oxide, etc. The point to be understood is that the solid components 109 should be dispersible in a substantially uniform manner throughout the liquid medium 107 such that the solid components 109 avoid clumping together into a form that cannot be forced to interact with the contaminants 103 present on the wafer 105.

As previously mentioned, the continuous liquid medium 107 can be either aqueous or non-aqueous. For example, an aqueous liquid medium 107 can be defined by de-ionized water in one embodiment. In another embodiment, a non-aqueous liquid medium 107 can be defined by a hydrocarbon, a fluorocarbon, a mineral oil, or an alcohol, among others. Irrespective of whether the liquid medium 107 is aqueous or non-aqueous, it should be understood that the liquid medium 107 can be modified to include ionic or non-ionic solvents and other chemical additives. For example, the chemical additives to the liquid medium 107 can include any combination of co-solvents, pH modifiers, chelating agents, polar solvents, surfactants, ammonia hydroxide, hydrogen peroxide, hydrofluoric acid, tetramethylammonium hydroxide, and rheology modifiers such as polymers, particulates, and polypeptides.

As previously mentioned, the immiscible components 111 within the cleaning material 101 can be defined in either the gas phase, the liquid phase, the solid phase, or a combination thereof. In the embodiment having the immiscible components 111 defined in the gas phase, the immiscible components 111 are defined as gas bubbles dispersed throughout the continuous liquid medium 107. In one embodiment, the gas bubbles are defined to occupy 5% to 99.9% of the cleaning material 101 by volume. In another embodiment, the gas bubbles are defined to occupy 50% to 95% of the cleaning material 101 by weight. The gas defining the immiscible components 111 can be either inert, e.g., $N_2$, Ar, etc., or reactive, e.g., $O_2$, $O_3$, $H_2O_2$, air, $H_2$, $NH_3$, HF, etc.

In the embodiment having the immiscible components 111 defined in the liquid phase, the immiscible components 111 are defined as liquid droplets dispersed throughout the continuous liquid medium 107, wherein the liquid droplets are immiscible within the liquid medium 107. The liquid defining the immiscible components 111 can be either inert or reactive. For example, a low-molecular weight alkane, e.g., pentane, hexane, heptane, octane, nonane, decane, or mineral oil may be used as an inert liquid for defining the immiscible components 111, wherein the liquid medium 107 is aqueous. In another example, oil soluble surface modifiers may be used as a reactive liquid for defining the immiscible components 111.

During the cleaning process, a downward force is exerted on the solid components 109 within the liquid medium 107 such that the solid components 109 are brought within close proximity or contact with the contaminants 103 on the wafer 105. The immiscible components 111 within the cleaning material 101 provide the mechanism by which the downward force is exerted on the solid components 109. When the solid component 109 is forced within sufficient proximity to or contact with the contaminant 103, an interaction is established between the solid component 109 and the contaminant 103. The interaction between the solid component 109 and the contaminant 103 is sufficient to overcome an adhesive force between the contaminant 103 and the wafer 105, as well as any repulsive forces between the solid component 109 and the contaminant. Therefore, when the solid component 109 is moved away from the wafer 105, the contaminant 103 that interacted with the solid component 109 is also moved away from the wafer 105, i.e., the contaminant 103 is cleaned from the wafer 105.

Figure 2A:
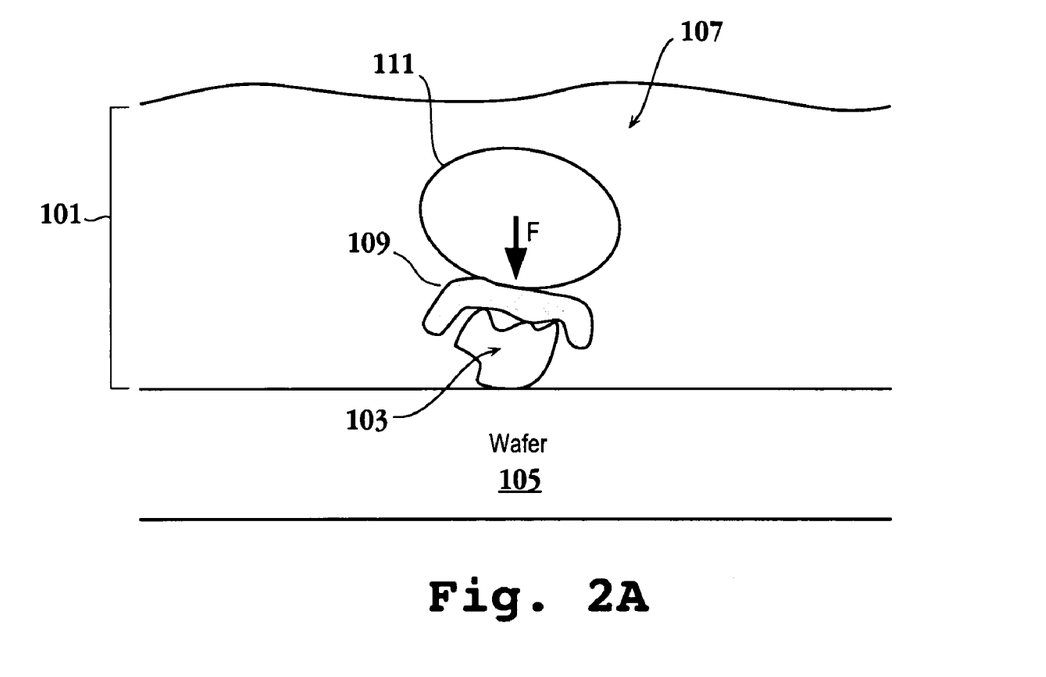
FIGS. 2A-2B are illustrations showing how the cleaning material functions to remove the contaminant from the wafer, in accordance with one embodiment of the present invention.
Figure 2B:
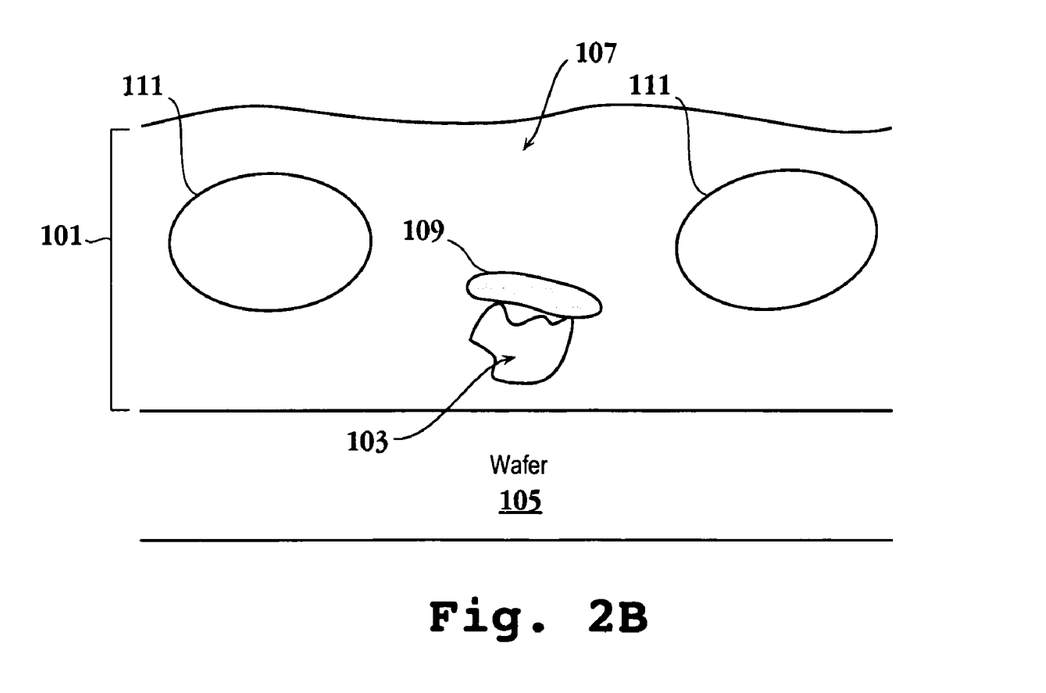

FIGS. 2A-2B are illustrations showing how the cleaning material 101 functions to remove the contaminant 103 from the wafer 105, in accordance with one embodiment of the present invention. It should be understood that the cleaning material 101 depicted in FIGS. 2A-2B possesses the same characteristics as previously described with respect to FIG. 1.

As shown in FIG. 2A, within the liquid medium 107 of the cleaning material 101, the solid component 109 is interposed between the contaminant 103 and the immiscible component 111. The immiscible component 111 within the liquid medium 107, whether gas bubbles or liquid droplets, has an associated surface tension. Therefore, when the immiscible component 111 is pressed downward against the solid component 109, the immiscible component 111 becomes deformed and exerts a downward force (F) on the solid component 109. This downward force (F), or a normal component of F, serves to move the solid component 109 toward the wafer 105 and contaminant 103 thereon. In one embodiment, the interaction between the solid component 109 and contaminant 103 occurs when the solid component 109 is forced sufficiently close to the contaminant 103. In one embodiment, this distance may be within about 10 nanometers. In another embodiment, the interaction between the solid component 109 and contaminant 103 occurs when the solid component 109 actually contacts the contaminant 103. This interaction may also be referred to as solid component 109 engaging contaminant 103.

The interaction force between the solid component 109 and the contaminant 103 is stronger than the force connecting the contaminant 103 to the wafer 105. Additionally, in an embodiment where the solid component 109 binds with the contaminant 103, a force used to move the solid component 109 away from the wafer 105 is stronger than the force connecting the contaminant 103 to the wafer 105. Therefore, as depicted in FIG. 2B, when the solid component 109 is moved away from the wafer 105, the contaminant 103 bound to the solid component 109 is also moved away from the wafer 105. It should be appreciated that because the solid components 109 interact with the contamination 103 to affect the cleaning process, contamination 103 removal across the wafer 105 will be dependent on how well the solid components 109 are distributed across the wafer 105. In a preferred embodiment, the solid components 109 will be so well distributed that essentially every contaminant 103 on the wafer 105 will be in proximity to at least one solid component 109. It should also be appreciated that one solid component 109 may come in contact with or interact with more than one contaminant 103, either in a simultaneous manner or in a sequential manner. Furthermore, solid component 109 may be a mixture of different components as opposed to all the same component. Thus, the cleaning solution is capable of being designed for a specific purpose, i.e., targeting a specific contaminant, or the cleaning solution can have a broad spectrum of contaminant targets where multiple solid components are provided.

Interaction between the solid component 109 and the contaminant 103 can be established through one or more mechanisms including adhesion, collision, and attractive forces, among others. Adhesion between the solid component 109 and contaminant 103 can be established through chemical interaction and/or physical interaction. For example, in one embodiment, chemical interaction causes a glue-like effect to occur between the solid component 109 and the contaminant 103. In another embodiment, physical interaction between the solid component 109 and the contaminant 103 is facilitated by the mechanical properties of the solid component 109. For example, the solid component 109 can be malleable such that when pressed against the contaminant 103, the contaminant 103 becomes imprinted within the malleable solid component 109. In another embodiment, the contaminant 103 can become entangled in a network of solid components 109. In this embodiment, mechanical stresses can be transferred through the network of solid components 109 to the contaminant 103, thus providing the mechanical force necessary for removal of the contaminant 103 from the wafer 105.

Deformation of the solid component 109 due to imprinting by the contaminant 103 creates a mechanical linkage between the solid component 109 and the contaminant 103. For example, a surface topography of the contaminant 103 may be such that as the contaminant 103 is pressed into the solid component 109, portions of the solid component 109 material enters regions within the surface topography of the contaminant 103 from which the solid component 109 material cannot easily escape, thereby creating a locking mechanism. Additionally, as the contaminant 103 is pressed into the solid component 109, a vacuum force can be established to resist removal of the contaminant 103 from the solid component 109.

In another embodiment, energy transferred from the solid component 109 to the contaminant 103 through direct or indirect contact may cause the contaminant 103 to be dislodged from the wafer 105. In this embodiment, the solid component 109 may be softer or harder than the contaminant 103. If the solid component 109 is softer than the contaminant 103, greater deformation of the solid component 109 is likely to occur during the collision, resulting in less transfer of kinetic energy for dislodging the contaminant 103 from the wafer 105. However, in the case where the solid component 109 is softer than the contaminant 103, the adhesive connection between the solid component 109 and the contaminant 103 may be stronger. Conversely, if the solid component 109 is at least as hard as the contaminant 103, a substantially complete transfer of energy can occur between the solid component 109 and the contaminant 103, thus increasing the force that serves to dislodge the contaminant 103 from the wafer 105. However, in the case where the solid component 109 is at least as hard as the contaminant 103, interaction forces that rely on deformation of the solid component 109 may be reduced. It should be appreciated that physical properties and relative velocities associated with the solid component 109 and the contaminant 103 will influence the collision interaction there between.

In addition to the foregoing, in one embodiment, interaction between the solid component 109 and contaminant 103 can result from electrostatic attraction. For example, if the solid component 109 and the contaminant 103 have opposite surface charges they will be electrically attracted to each other. It is possible that the electrostatic attraction between the solid component 109 and the contaminant 103 can be sufficient to overcome the force connecting the contaminant 103 to the wafer 105.

In another embodiment, an electrostatic repulsion may exist between the solid component 109 and the contaminant 103. For example, both the solid component 109 and the contaminant 103 can have either a negative surface charge or a positive surface charge. If the solid component 109 and the contaminant 103 can be brought into close enough proximity, the electrostatic repulsion there between can be overcome through van der Waals attraction. The force applied by the immiscible component 111 to the solid component 109 may be sufficient to overcome the electrostatic repulsion such that van der Waals attractive forces are established between the solid component 109 and the contaminant 103. Further details of this embodiment, are provided with reference to FIG. 4. Additionally, in another embodiment, the pH of the liquid medium 107 can be adjusted to compensate for surface charges present on one or both of the solid component 109 and contaminant 103, such that the electrostatic repulsion there between is reduced to facilitate interaction, or so that either the solid component or the contamination exhibit surface charge reversal relative to the other resulting in electrostatic attraction.

Figure 3:
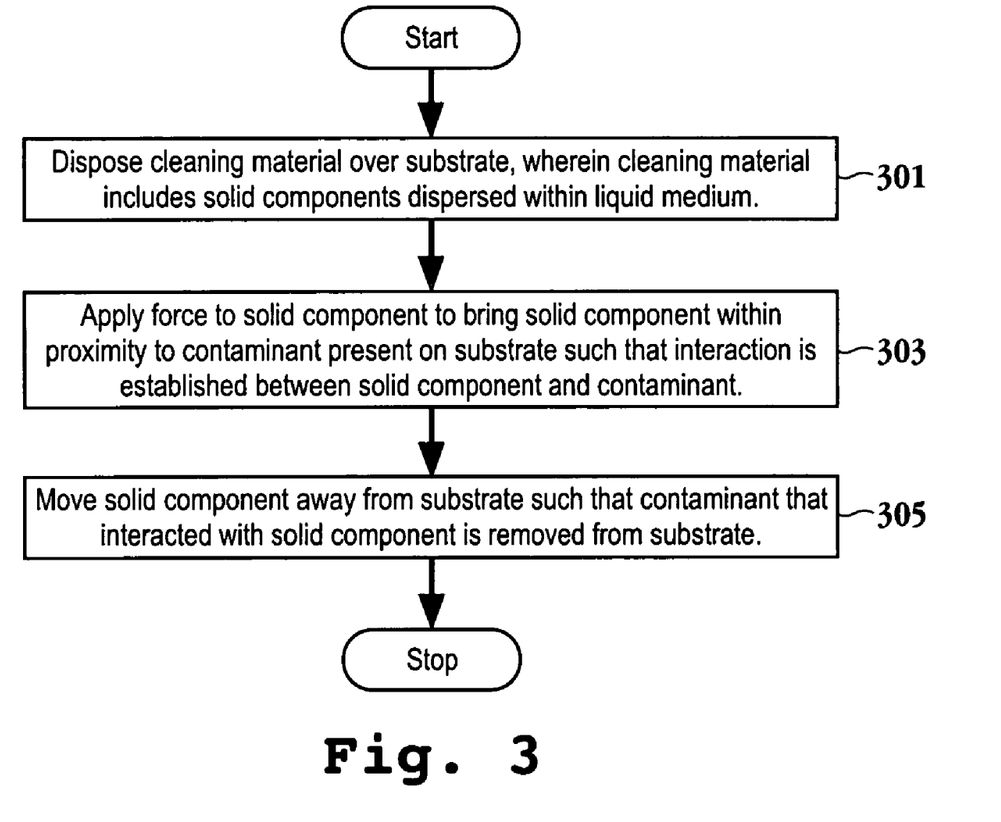
FIG. 3 is an illustration showing a flowchart of a method for removing contamination from a substrate, in accordance with one embodiment of the present invention.

FIG. 3 is an illustration showing a flowchart of a method for removing contamination from a substrate, in accordance with one embodiment of the present invention. It should be understood that the substrate referenced in the method of FIG. 3 can represent a semiconductor wafer or any other type of substrate from which contaminants associated with a semiconductor fabrication process need to be removed. Also, the contaminants referenced in the method of FIG. 3 can represent essentially any type of contaminant associated with the semiconductor wafer fabrication process, including but not limited to particulate contamination, trace metal contamination, organic contamination, photoresist debris, contamination from wafer handling equipment, and wafer backside particulate contamination.

The method of FIG. 3 includes an operation 301 for disposing a cleaning material over a substrate, wherein the cleaning material includes solid components dispersed within a liquid medium. The cleaning material referenced in the method of FIG. 3 is the same as previously described with respect to FIGS. 1, 2A, and 2B. Therefore, the solid components within the cleaning material are dispersed in suspension within the liquid medium. Also, the solid components are defined to avoid damaging the substrate and to avoid adherence to the substrate. In one embodiment, the solid components are defined as crystalline solids. In another embodiment, the solid components are defined as non-crystalline solids. In yet another embodiment, the solid components are represented as a combination of crystalline and non-crystalline solids. Additionally, in various embodiments, the liquid medium can be either aqueous or non-aqueous.

The method also includes an operation 303 for applying a force to a solid component to bring the solid component within proximity to a contaminant present on the substrate, such that an interaction is established between the solid component and the contaminant. As previously discussed, immiscible components are provided within the cleaning material to apply the force to the solid component necessary to bring the solid component within proximity to the contaminant. In one embodiment, the method can include an operation for controlling the immiscible components to apply a controlled amount of force to the solid component. The immiscible components can be defined as gas bubbles or immiscible liquid droplets within the liquid medium. Additionally, the immiscible components can be represented as a combination of gas bubbles and immiscible liquid droplets within the liquid medium.

In one embodiment of the method, the immiscible components are defined within the liquid medium prior to disposing the cleaning material over the substrate. However, in another embodiment, the method can include an operation to form the immiscible components in-situ following disposition of the cleaning material over the substrate. For example, the immiscible components can be formed from a dissolved gas within the liquid medium upon a decrease in ambient pressure relative to the cleaning material. It should be appreciated that formation of the immiscible components in situ may enhance the contamination removal process. For example, in one embodiment, gravity serves to pull the solid components toward the substrate prior to formation of the immiscible components. Then, the ambient pressure is reduced such that gas previously dissolved within the liquid medium comes out of solution to form gas bubbles. Because the solid components have settled by gravity toward the substrate, the majority of gas bubbles will form above the solid components. Formation of the gas bubbles above the solid components, with the solid components already settled toward the substrate, will serve to enhance movement of the solid components to within proximity of the contaminants on the substrate.

In various embodiments, the interaction between the solid component and the contaminant can be established by adhesive forces, collision forces, attractive forces, or a combination thereof. Also, in one embodiment, the method can include an operation for modifying a chemistry of the liquid medium to enhance interaction between the solid component and the contaminant. For example, the pH of the liquid medium can be modified to cancel surface charges on one or both of the solid component and contaminant such that electrostatic repulsion is reduced.

Additionally, in one embodiment, the method can include an operation for controlling a temperature of the cleaning material to enhance interaction between the solid component and the contaminant. More specifically, the temperature of the cleaning material can be controlled to control the properties of the solid component. For example, at a higher temperature the solid component may be more malleable such that it conforms better when pressed against the contaminant. Then, once the solid component is pressed and conformed to the contaminant, the temperature is lowered to make the solid component less malleable to better hold its conformal shape relative to the contaminant, thus effectively locking the solid component and contaminant together. The temperature may also be used to control the solubility and therefore the concentration of the solid components. For example, at higher temperatures the solid component may be more likely to dissolve in the liquid medium. The temperature may also be used to control and/or enable formation of solid components in-situ on the wafer from liquid-liquid suspension.

In a separate embodiment, the method can include an operation for precipitating solids dissolved within the continuous liquid medium. This precipitation operation can be accomplished by dissolving the solids into a solvent and then adding a component that is miscible with the solvent but that does not dissolve the solid. Addition of the component that is miscible with the solvent but that does not dissolve the solid causes the precipitation of a solid component.

The method further includes an operation 305 for moving the solid component away from the substrate such that the contaminant that interacted with the solid component is removed from the substrate. In one embodiment, the method includes an operation for controlling a flow rate of the cleaning material over the substrate to control or enhance movement of the solid component and/or contaminant away from the substrate. The method of the present invention for removing contamination from a substrate can be implemented in many different ways so long as there is a means for applying a force to the solid components of the cleaning material such that the solid components establish an interaction with the contaminants to be removed.

Figure 4:
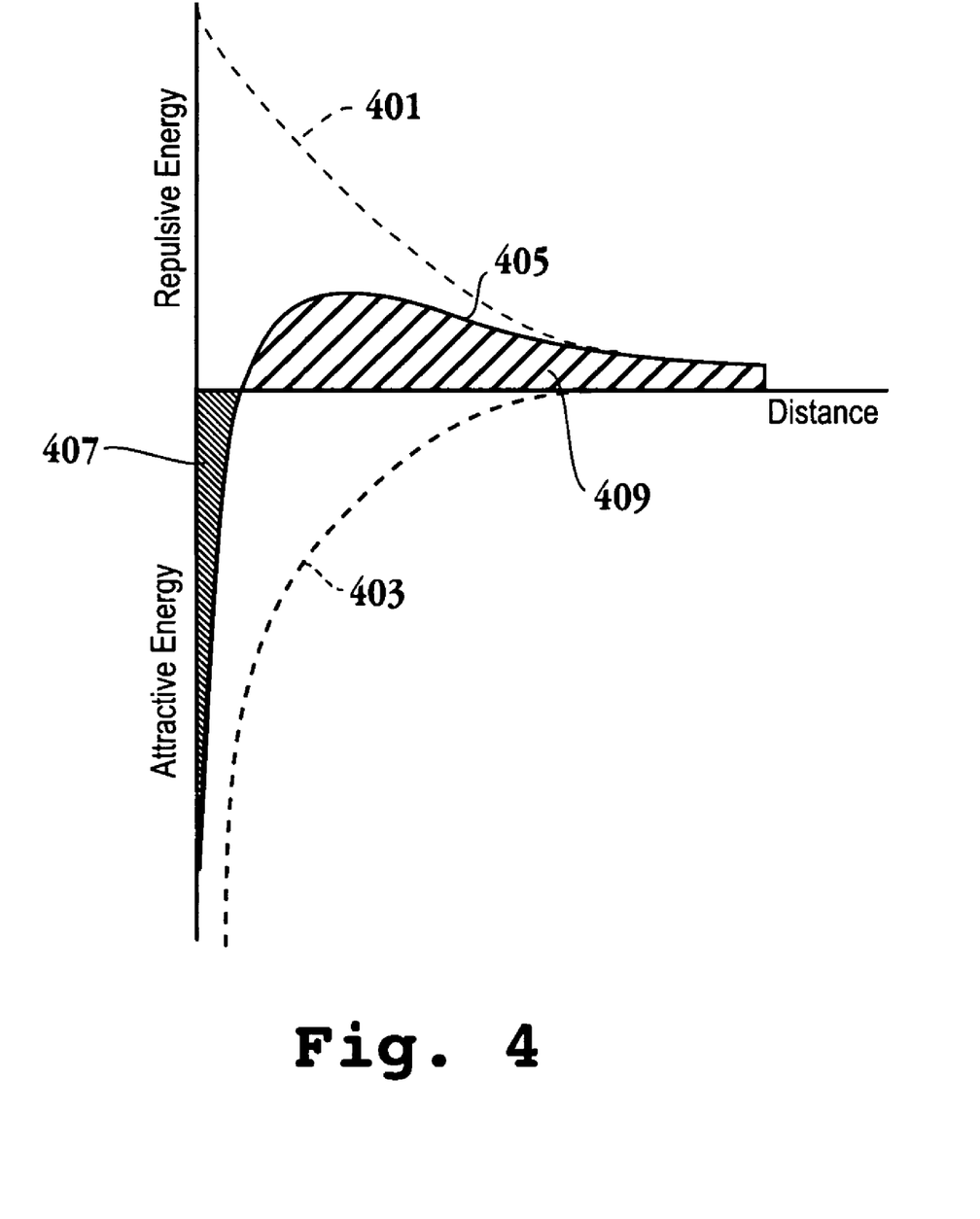
FIG. 4 is a simplified schematic diagram illustrating a graph depicting the net interaction energy curve formed when subtracting the attraction curve from the repulsion curve in accordance with one embodiment of the invention.

FIG. 4 is a simplified schematic diagram illustrating a graph depicting the net interaction energy curve formed when subtracting the attraction curve from the repulsion curve in accordance with one embodiment of the invention. As illustrated in FIG. 4 electrical repulsion is depicted by line 401 while Van der Waals attraction is depicted by line 403. The Y-axis represents energy with repulsive energy being shown above the X-axis and attractive energy illustrated below the X-axis. The X-axis represents distance between particles. The net interaction energy is depicted by curve 405 and is simply the sum of lines 401 and 403. Region 407 may be referred to as an energy trap, while region 409 may be referred to as an energy barrier. One skilled in the art will appreciate that electrostatic repulsion becomes significant when two particles/colloids approach each other and their double layers begin to interfere. Energy is required to overcome this repulsion. In one embodiment described herein, this energy may be provided by the cleaning solution, or more specifically, an immiscible component of the cleaning solution, as described above. The electrostatic repulsion curve 401 indicates the energy that must be overcome if the particles are to be forced together. It should be appreciated that the maximum energy is related to the surface potential and the zeta potential.

Van der Waals attraction is actually the result of forces between individual molecules in each particle/colloid. The effect is additive; that is, one molecule of the first particle/colloid has a Van der Waals attraction to each molecule in the second colloid. This is repeated for each molecule in the first particle/colloid, and the total force is the sum of all of these. The attractive energy curve 403 is used to indicate the variation in Van der Walls force with distance between the particles. At each distance on the X axis the smaller value is subtracted from the larger value to get the net energy. The net value is then plotted, above if repulsive and below if attractive, and a curve is formed. If there is a repulsive section, then the point of maximum repulsive energy is called the energy barrier 409. The height of energy barrier 409 indicates how stable the system is. In order to agglomerate, two particles on a collision course must have sufficient kinetic energy due to their velocity mass to jump over this barrier. If the barrier is cleared, then the net interaction is all attractive and as a result, the particles agglomerate. This inner region 407 is referred to as an energy trap since the particles/colloids can be considered to be trapped together by Van der Waals forces. One skilled in the art will appreciate that the environmental conditions for a colloidal solution may be altered to either increase or decrease the energy barrier, depending on the particular application. The conditions that can be altered include changing ionic strength, changing pH, or adding surface-active materials to directly affect the charge of the colloid. In each case, zeta potential measurements can indicate the impact of the alternation on overall stability.

Figure 5:
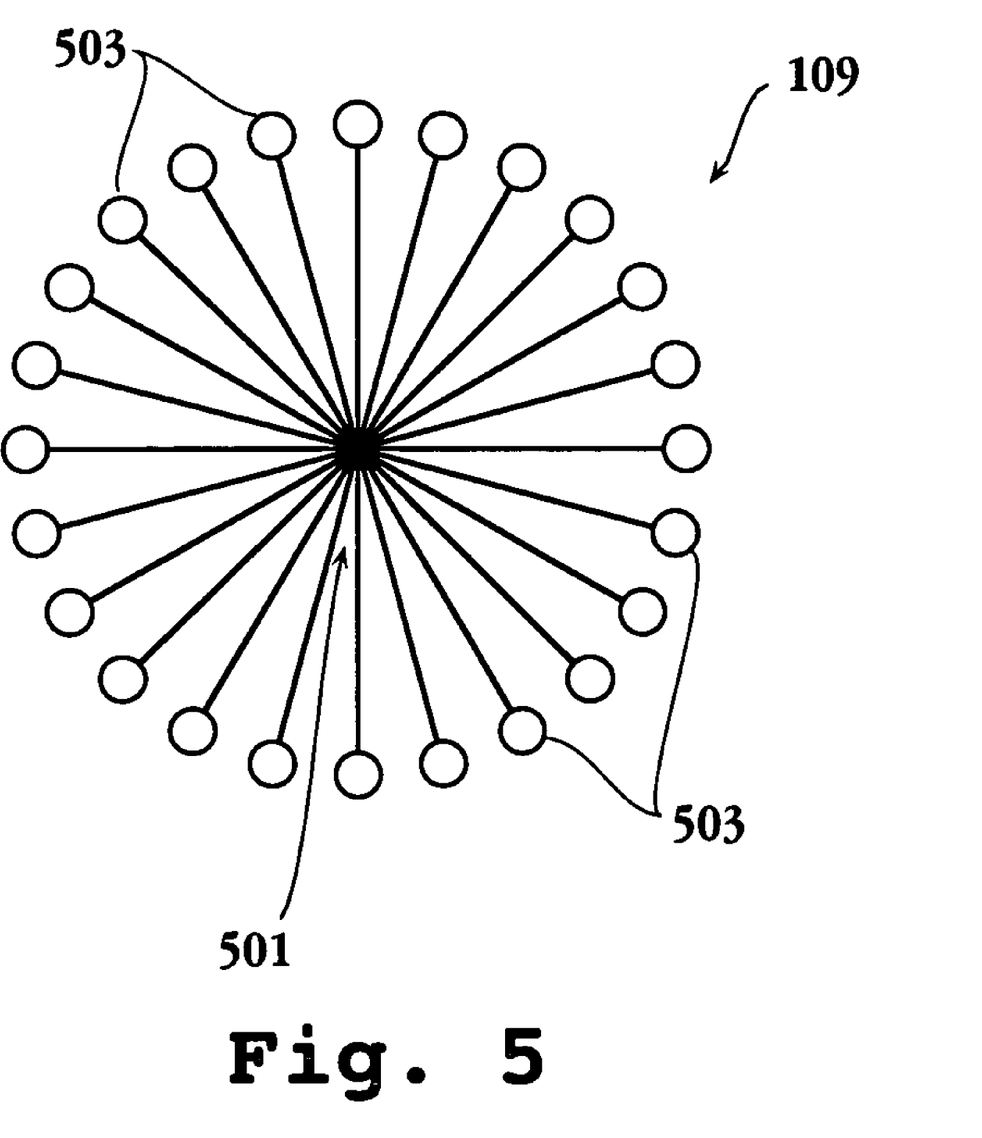
FIG. 5 is a simplified schematic diagram illustrating an aggregate of surfactant molecules, which may form the solid particles described herein, in accordance with one embodiment of the invention.

FIG. 5 is a simplified schematic diagram illustrating an aggregate/assembly of surfactant molecules, which may form the solid particles described herein, in accordance with one embodiment of the invention. Typically the aggregate/assembly of surfactant molecules, is usually of a globular shape, but other geometrical shapes are also possible, e.g., ellipsoid, cylinder, vesicles, lamellae, etc. One skilled in the art will appreciate that the aggregate/assembly of surfactant molecules may also be referred to a micelle. Micelles form when a concentration of surfactant is greater than the critical micellar concentration (CMC), and the temperature of the system is greater than the critical micellar temperature. As is generally known surfactants are chemicals that contain both hydrophobic groups, e.g. long hydrocarbon chains, and hydrophilic groups, e.g., ionic or polar groups. Thus, in an aqueous or other polar solvent, the core 501 of the micelle consists of the hydrophobic portion of the molecules, while the hydrophilic portions 503 remain on the surface of the molecule so that they can maintain favorable contact with water. In the case of ionic surfactants, in one embodiment, the electric charge of the ionic heads is neutralized by the oppositely charged ions (counter ions) located in the layer around the micelle, to fulfill the condition of electroneutrality. In an alternate embodiment, where a non-polar solvent is used in the continuous phase, the hydrophilic groups will form the core of the micelle, and the hydrophobic groups remain on the surface of the micelle, i.e. a reverse micelle. Thus, in one embodiment, the micelle 109 represents an agglomeration/assembly of surface-active molecules that may function as the solid components 109. Of course, it should be understood that this is just one exemplary embodiment and that solid components may be formed through other techniques mentioned above.

Described below are exemplary techniques for manufacturing the cleaning solution. It should be appreciated that these are exemplary techniques directed at the use of stearic acid with an aqueous continuous phase that may be combined into a foam application or an emulsion application. Example 1 provides a technique requiring melting of the fatty acid and Example 2 pre-mills the fatty acid to achieve a desirable particle distribution, thereby eliminating the need to melt the fatty acid. Example 3 provides a technique where dissolved fatty acids are precipitated from a solvent to achieve a desirable particle distribution. Of course, numerous other techniques may be utilized to manufacture the cleaning solution and different fatty acids may be used. In addition, a non-polar solvent may be used in place of water and a non-polar or a polar compound may be mixed/dissolved in the non-polar solvent.

EXAMPLE 1

Water is heated to above 70 degrees Celsius (the melting point of Stearic acid). Solid Stearic acid (about 0.1% by weight to about 10% by weight) is heated above 70 degrees Celsius and added to the heated water. The water-stearic acid mixture is stirred at a rate so that the immiscible stearic acid is dispersed or emulsified within the continuous water phase. Ionization of the stearic acid is initiated by adding a base to bring the pH up to a point where about 50% of the carboxylic acid is dissociated, i.e., the dissociation constant ($pK_a$) is about 50%. This occurs at a pH of about 10.2. An exemplary base added to the solution to bring the pH up is ammonium hydroxide ($NH_4OH$). The concentration of the $NH_4OH$ can range between 0.25% and 10% by weight. The stearic acid/water/$NH_4OH$ mixture is stirred for an additional 20 minutes to form a homogeneous solution. The solution cools to ambient and sits for 10 hours and over time a precipitate forms, i.e., the solid components. During stirring, air can be entrained into the mixture but it is not necessary. The size distribution of these precipitate particles (solid components) is between about 50 nanometers and 5000 micrometers.

EXAMPLE 2

The granular stearic acid is milled to a particle size distribution between about 0.5 and about 5000 micrometers. Any commercially available powder mill may achieve this size distribution. The milled Stearic acid (about 0.1% by weight to about 10% by weight) in granular form is added to water while agitating the solution. The solution can be agitated by shaking, stirring, rotating, etc. Dissociation of the stearic acid is initiated by adding a base to bring the pH up to a point where about 50% of the carboxylic acid is dissociated, i.e., the $pK_a$ is about 50%. This occurs at a pH of above 10.2. An exemplary base added to the solution to bring the pH up is ammonium hydroxide ($NH_4OH$). The concentration of the $NH_4OH$ can range between 0.5% and 10% by weight. Adding $NH_4OH$ to the aqueous solution while agitating the solution disperses the solid stearic acid component into the continuous water phase. The ionized solid stearic acid component remains suspended within the continuous aqueous phase without agitation. The size distribution of these particles is between about 0.5 and about 5,000 micrometers.

EXAMPLE 3

A mixture of stearic and palmitic acids is dissolved in isopropanol (IPA) while agitating the solution. The concentration of dissolved fatty acids in the solvent can range from about 2% to 20% by weight. Heating of the solvent below the boiling point of the solvent or addition of another organic solvent or solvents, such as acetone or benzene, can improve solubility of the fatty acid. The solution can be agitated by shaking, stirring, rotating, etc. Once the dissolution is complete, the remaining solids can be removed by filtration or centrifugation. The solid-free solution is next mixed with water (a non-solvent for the fatty acid) to precipitate a fatty-acid solid. The precipitated fatty acid becomes suspended in solution with the size distribution in the range between 0.5 and 5,000 microns. Ionization of the stearic acid can be initiated by adding a base to bring the pH up to 10.2 or higher. An exemplary base added to the solution to bring the pH up is ammonium hydroxide ($NH_4OH$). The concentration of the $NH_4OH$ can range between 0.25% and 10% by weight.

Figure 6A:
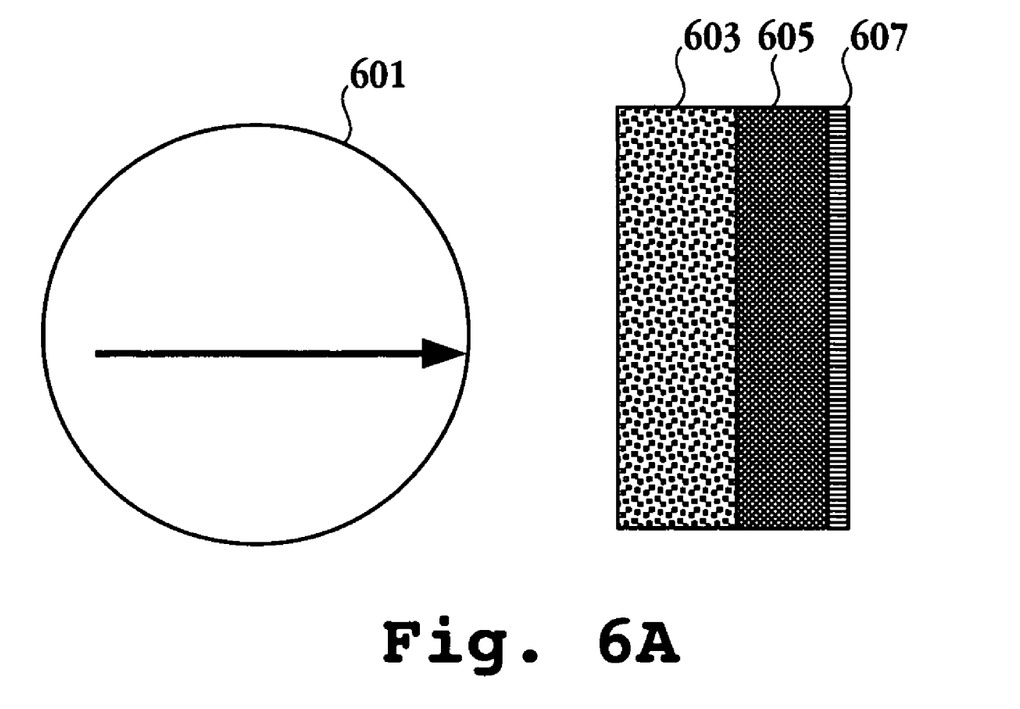
FIG. 6A is a simplified schematic diagram of a top view of a system for cleaning a substrate in accordance with one embodiment of the invention.

FIG. 6A is a simplified schematic diagram of a top view of a system for cleaning a substrate in accordance with one embodiment of the invention. Substrate 601 moves in a linear direction toward the cleaning head. The cleaning head includes a portion 603 configured to provide the cleaning solution. As described above, the cleaning solution may be in the form of a foam or an emulsion. In one embodiment, the cleaning solution is delivered from a reservoir, which may or may not be pressurized. If the reservoir is pressurized, the cleaning solution may be aerated and develop into a foam prior to being delivered to the cleaning head. Where the reservoir is not pressurized, the cleaning solution may be pumped or delivered through other commonly known means. In another embodiment, an emulsion may be delivered to the cleaning head from an off-line reservoir. Portion 605 includes a rinse chemistry, such as deionized water (DIW) or some other cleaning chemistry commonly used for the particular application. Portion 607 of the cleaning head provides the drying capability and may utilize an inert gas, such as Nitrogen and/or a low vapor pressure liquid such as isopropyl alcohol (IPA). It should be appreciated that portions 605 and 607, which are located downstream from the cleaning portion 603 in one embodiment, may provide a cleaning meniscus and may be the proximity cleaning head owned by the assignee and further described in the cross referenced applications listed below. One skilled in the art will appreciate that substrate 601 may rotate and/or rotate and move linearly. Alternatively, the cleaning head may move over substrate 601 while the substrate is stationary or also moving. In yet another embodiment, the cleaning may be performed in a cleaning compartment where a single wafer is deposited and the cleaning solution is applied. In still yet another embodiment, a tool providing sequential compartments for each of portion 603, 605, and 607 may be provided. In another embodiment, the cleaning head may include two portions 603 for cleaning solution with portion 605 sandwiched in between the two portions 603. Thus, numerous configurations are available for the functionality described herein.

Figure 6B:
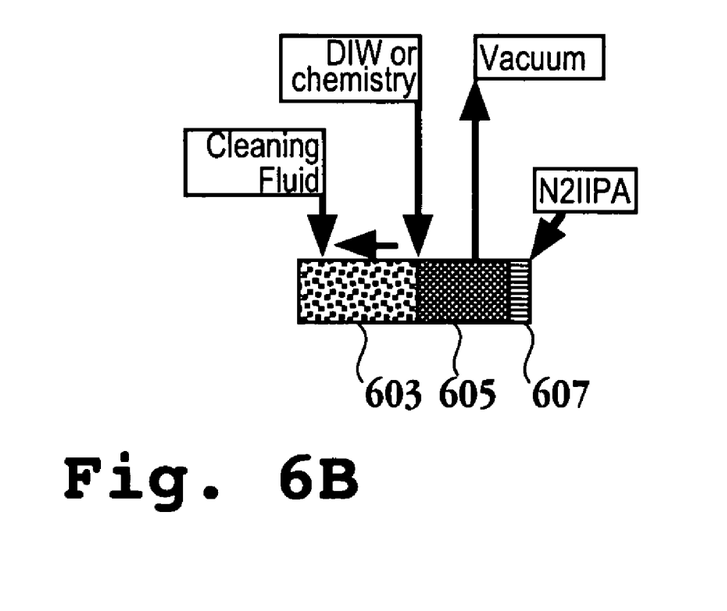
FIG. 6B is a simplified schematic diagram of a side view of the system depicted in FIG. 6A for cleaning a substrate in accordance with one embodiment of the invention.

FIG. 6B is a side view of the cleaning head of FIG. 6A. Cleaning fluid is supplied to portion 603 as mentioned above. DIW and/or some other suitable cleaning chemistry may be provided to portion 605. Vacuum may optionally be provided to portion 605 also to provide a meniscus as discussed in the cross-referenced application below in more detail. An inert gas and/or IPA are provided to portion 607. Here again, while FIGS. 6A and 6B are illustrated with respect to a semiconductor substrate, the embodiments may be extended to flat panel displays, solar cells, memory devices, etc.

For additional information about the proximity vapor clean and dry system, reference can be made to an exemplary system described in the U.S. Pat. No. 6,488,040, issued on Dec. 3, 2002 and entitled "CAPILLARY PROXIMITY HEADS FOR SINGLE WAFER CLEANING AND DRYING." This U.S. Patent Application, which is assigned to Lam Research Corporation, the assignee of the subject application, is incorporated herein by reference.

For additional information with respect to the proximity head, reference can be made to an exemplary proximity head, as described in the U.S. Pat. No. 6,616,772, issued on Sep. 9, 2003 and entitled "METHODS FOR WAFER PROXIMITY CLEANING AND DRYING." This U.S. Patent Application, which is assigned to Lam Research Corporation, the assignee of the subject application, is incorporated herein by reference.

For additional information about top and bottom menisci, reference can be made to the exemplary meniscus, as disclosed in U.S. patent application Ser. No. 10/330,843, filed on Dec. 24, 2002 and entitled "MENISCUS, VACUUM, IPA VAPOR, DRYING MANIFOLD." This U.S. Patent Application, which is assigned to Lam Research Corporation, the assignee of the subject application, is incorporated herein by reference.

For additional information about menisci, reference can be made to U.S. Pat. No. 6,998,327, issued on Jan. 24, 2005 and entitled "METHODS AND SYSTEMS FOR PROCESSING A SUBSTRATE USING A DYNAMIC LIQUID MENISCUS," and U.S. Pat. No. 6,998,326, issued on Jan. 24, 2005 and entitled "PHOBIC BARRIER MENISCUS SEPARATION AND CONTAINMENT." These U.S. Patents, which are assigned to the assignee of the subject application, are incorporated herein by reference in their entirety for all purposes In some contemplated embodiments, the continuous phase or dispersant phase includes those compounds that are considered part of the hydrocarbon family. Hydrocarbon compounds are those compounds that comprise carbon and hydrogen. It should be understood that a majority of hydrocarbon compounds are non-polar, and therefore less polar than water; however, there are a few hydrocarbon compounds that could be considered to be as polar or more polar than water. Hydrocarbon compounds are generally broken down into three classes: aliphatic, cyclic and aromatic. Aliphatic hydrocarbon compounds may comprise both straight-chain compounds and compounds that are branched and possibly cross-linked, however, aliphatic hydrocarbon compounds are not considered cyclic. Cyclic hydrocarbon compounds are those compounds that comprise at least three carbon atoms oriented in a ring structure with properties similar to aliphatic hydrocarbon compounds. Aromatic hydrocarbon solvents are those compounds that comprise generally three or more unsaturated bonds with a single ring or multiple rings attached by a common bond and/or multiple rings fused together. Contemplated hydrocarbon compounds include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, fluorinated hydrocarbons, nitrated hydrocarbons, benzene, 1,2-dimethylbenzene, 1,2,4-trimethylbenzene, mineral spirits, kerosine, isobutylbenzene, methylnaphthalene, ethyltoluene, ligroine. Particularly contemplated solvents include, but are not limited to, pentane, hexane, heptane, cyclohexane, benzene, toluene, xylene and mixtures or combinations thereof.

In other contemplated embodiments, the continuous phase or dispersant phase may comprise those compounds that are not considered part of the hydrocarbon family of compounds, such as ketones, which include fluorinated ketones, e.g., acetone, diethyl ketone, methyl ethyl ketone and the like, alcohols, which include fluorinated alcohols, esters, which include fluorinated esters, fluorinated and non-fluorinated carbonate-based compounds, such as propylene carbonate and the like, ethers, which include fluorinated ethers, and amines, which include fluorinated amines. In yet other contemplated embodiments, the continuous phase or dispersant phase may comprise a combination of any of the compounds mentioned herein. Thus, where the continuous phase is a polar solvent such as water, the above listed non-polar compounds may be used in the dispersed phase, as the non-polar compounds are typically immiscible with polar solvents. Of course, the non-polar compounds may be used in the continuous phase for certain applications and the polar compounds may be used for the dispersed phase. Exemplary polar solvents besides water include acetic acid, formic acid, methanol, ethanol, n-propanol, n-butanol, isopropanol, acetone, acetonitrile, dimethylformamide, dimethyl sulfoxide, and mixtures thereof. It should be appreciate that the lists of materials provided herein are meant to be exemplary and not limiting.

Although the present invention has been described in the context of removing contaminants from a semiconductor wafer, it should be understood that the previously described principles and techniques of the present invention can be equally applied to cleaning surfaces other than semiconductor wafers. For example, the present invention can be used to clean any equipment surface used in semiconductor manufacturing, wherein any equipment surface refers to any surface that is in environmental communication with the wafer, e.g., shares air space with the wafer. The present invention can also be used in other technology areas where contamination removal is important. For example, the present invention can be used to remove contamination on parts used in the space program, or other high technology areas such as surface science, energy, optics, microelectronics, MEMS, flat-panel processing, solar cells, memory devices, etc. It should be understood that the aforementioned listing of exemplary areas where the present invention may be used is not intended to represent an inclusive listing. Furthermore, it should be appreciated that the wafer as used in the exemplary description herein can be generalized to represent essentially any other structure, such as a substrate, a part, a panel, etc.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:
1. A cleaning compound, comprising:
   about 0.5 weight percent to about 10 weight percent of a fatty acid dispersed in water;
   an amount of a base sufficient to bring a pH of the fatty acid water solution to 10.2 or greater to a level where about 50% of the dispersed fatty acid is ionized;
   a first immiscible component in a liquid phase dispersed in the water; and
   a second immiscible component in a gas phase dispersed in the water.

2. The cleaning compound of claim 1 wherein the fatty acid is stearic acid.

3. The cleaning compound of claim 1, wherein the fatty acid is selected from the group consisting of lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid and mixtures thereof.

4. The cleaning compound of claim 1, wherein the fatty acid has a particle size distribution between about 50 nanometers and 5000 micrometers.

5. The cleaning compound of claim 1, wherein an acid moiety of the fatty acid is selected from a group consisting of carbonic, sulfonic, and phosphonic moieties.

6. The cleaning compound of claim 1, wherein the fatty acid is melted prior to being added to the water.

7. The cleaning compound of claim 1, further comprising:
   about 0.1 weight percent to about 10 weight percent of another fatty acid dispersed in the water.

8. A cleaning solution for cleaning a substrate prepared by a process comprising method operations of:
   adding a fatty acid to isopropanol while agitating to achieve a dissolved fatty acid concentration between about 2% and about 20% by weight;
   removing any undissolved solids from the isopropanol solution;
   mixing the isopropanol solution with water to precipitate the dissolved fatty acid;
   ionizing the dissolved fatty acid; and
   dispersing a first immiscible component in a liquid phase in the water; and
   dispersing a second immiscible component in a gas phase in the water.

9. The cleaning solution of claim 8, wherein the fatty acid is a mixture of stearic acid and palmitic acid.

10. The cleaning solution of claim 8, wherein the method operation of removing any undissolved solids from the isopropanol solution includes,
    filtering the isopropanol solution.

11. The cleaning solution of claim 8, wherein the method operation of ionizing the dissolved fatty acid includes,
    adding a base to the isopropanol solution after mixing the isopropanol solution with water.

12. The cleaning solution of claim 8, wherein the method operation of ionizing the dissolved fatty acid includes,
    adding a base to the isopropanol solution to bring a pH of the isopranol solution to 10.2 or greater after mixing the isopropanol solution with water.

13. The cleaning solution of claim 12, wherein the base is $NH_4OH$ and a concentration of the $NH_4OH$ is between about 0.25% and about 10% by weight.

14. A cleaning compound for cleaning a semiconductor substrate, consisting essentially of:
    about 0.5 weight percent to about 10 weight percent of a fatty acid dispersed in water;
    an amount of a base sufficient to bring a pH of the fatty acid water solution to above a level where about 50% of the dispersed fatty acid is ionized;
    a first immiscible component in a liquid phase dispersed in the water; and
    a second immiscible component in a gas phase dispersed in the water.

15. The cleaning compound of claim 14 wherein the fatty acid is stearic acid.

16. The cleaning compound of claim 14, wherein the pH is about 10.2.

17. The cleaning compound of claim 14, wherein the fatty acid is selected from the group consisting of lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid and mixtures thereof.

18. The cleaning compound of claim 14, wherein the fatty acid has a particle size distribution between about 50 nanometers and 5000 micrometers.

19. The cleaning compound of claim 14, wherein an acid moiety of the fatty acid is selected from a group consisting of carbonic, sulfonic, and phosphonic moieties.

20. The cleaning compound of claim 14, wherein the cleaning compound further includes about 0.1 weight percent to about 10 weight percent of another fatty acid dispersed in the water.

21. The cleaning compound of claim 14, wherein the fatty acid is melted prior to being added to the water.

22. A cleaning compound for cleaning a semiconductor substrate, consisting of:

about 0.5 weight percent to about 10 weight percent of a fatty acid dispersed in water;

an amount of a base sufficient to bring a pH of the fatty acid water solution to above a level where about 50% of the dispersed fatty acid is ionized;

a first immiscible component in a liquid phase dispersed in the water; and a second immiscible component in a gas phase dispersed in the water.

23. The cleaning compound of claim 14 wherein the fatty acid is stearic acid.

24. The cleaning compound of claim 14, wherein the pH is about 10.2.

25. The cleaning compound of claim 1, wherein the second immiscible component is an inert gas.

26. The cleaning compound of claim 1, wherein the second immiscible component is a reactive gas.

27. The cleaning compound of claim 1, wherein the first immiscible component is an alkane.

28. The cleaning compound of claim 1, wherein the first immiscible component is an oil soluble surface modifier.

* * * * *